(12) United States Patent
Chou

(10) Patent No.: US 8,462,571 B2
(45) Date of Patent: Jun. 11, 2013

(54) DRAM AND METHOD FOR TESTING THE SAME IN THE WAFER LEVEL BURN-IN TEST MODE

(75) Inventor: Min-Chung Chou, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 76 days.

(21) Appl. No.: 13/185,515

(22) Filed: Jul. 19, 2011

(65) Prior Publication Data
US 2013/0021862 A1    Jan. 24, 2013

(51) Int. Cl.
G11C 29/00    (2006.01)
(52) U.S. Cl.
USPC ...... 365/201; 365/149; 365/150; 365/189.05; 365/230.08
(58) Field of Classification Search
USPC ............ 365/201, 149, 150, 189.05, 230.08
See application file for complete search history.

(56) References Cited

U.S. PATENT DOCUMENTS

| | | | |
|---|---|---|---|
| 4,855,628 A | 8/1989 | Jun | |
| 5,130,581 A | 7/1992 | Oh et al. | |
| 5,381,373 A * | 1/1995 | Ohsawa | 365/201 |
| 5,790,465 A * | 8/1998 | Roh et al. | 365/201 |
| 5,896,320 A | 4/1999 | Taguchi | |
| 6,243,308 B1 * | 6/2001 | Lin | 365/201 |
| 6,781,899 B2 | 8/2004 | Han et al. | |
| 7,009,897 B2 * | 3/2006 | Sakemi | 365/201 |
| 7,298,157 B2 | 11/2007 | Kim | |
| 8,223,568 B2 * | 7/2012 | Seo | 365/203 |

* cited by examiner

Primary Examiner — Pho M Luu
(74) Attorney, Agent, or Firm — Jianq Chyun IP Office

(57) ABSTRACT

A dynamic random-access memory (DRAM) and a method for testing the DRAM are provided. The DRAM includes a memory cell, a bit line associated with the memory cell, a local buffer, and a bit line sense amplifier (BLSA). The local buffer receives a first power voltage as power supply. The local buffer provides a ground voltage to the bit line when a data signal is de-asserted and provides the first power voltage to the bit line when the data signal is asserted. The BLSA receives a second power voltage as power supply. The BLSA provides the second power voltage to the bit line when the data signal and a wafer level burn-in test signal are both asserted. The second power voltage may be higher than the first power voltage. The wafer level burn-in test signal is asserted when the DRAM is in a wafer level burn-in test mode.

9 Claims, 4 Drawing Sheets

DRAM AND METHOD FOR TESTING THE SAME IN THE WAFER LEVEL BURN-IN TEST MODE

BACKGROUND OF THE INVENTION

1. Field of the Invention

The present invention relates to a dynamic random-access memory (DRAM) and a method for testing the DRAM. More particularly, the present invention relates to a DRAM and a method for testing the DRAM in the wafer level burn-in test mode.

2. Description of the Related Art

The wafer level burn-in test is a test of writing data into a DRAM performed when the fabrication of the wafer containing the DRAM is just finished. If a DRAM does not pass its wafer level burn-in test, the DRAM will not be packaged into an individual integrated circuit (IC) in order to reduce manufacturing cost.

When a data of logic one is written into a DRAM, the voltage level of the data signal received by the DRAM is usually the same as that of the power supply voltage of the DRAM. In some circumstances, the wafer level burn-in test would be better if a data signal at a higher voltage level can be written into a DRAM for the test. For example, a surge of high voltage may burst into a DRAM in an event of lightning strike. A wafer level burn-in test using a data voltage higher than the power supply voltage of the DRAM would be very helpful in evaluating the resistance of the DRAM to such events.

SUMMARY OF THE INVENTION

Accordingly, the present invention is directed to a DRAM and a method for testing the DRAM. The DRAM and the method can write a higher data voltage to bit lines of the DRAM in the wafer level burn-in test mode to improve the test.

According to an embodiment of the present invention, a DRAM is provided. The DRAM includes a memory cell for storing a data bit, a bit line associated with the memory cell, a local buffer coupled to the bit line, and a bit line sense amplifier (BLSA) coupled to the bit line. The local buffer receives a first power voltage as power supply. The local buffer provides a ground voltage to the bit line when a data signal is de-asserted and provides the first power voltage to the bit line when the data signal is asserted. The BLSA receives a second power voltage as power supply. The BLSA provides the second power voltage to the bit line when the data signal and a wafer level burn-in test signal are both asserted. The second power voltage may be higher than the first power voltage. The wafer level burn-in test signal is asserted when the DRAM is in a wafer level burn-in test mode.

According to another embodiment of the present invention, a method for testing the aforementioned DRAM is provided. The method includes the following steps. Provide the ground voltage to the bit line associated with the memory cell of the DRAM when the data signal is de-asserted. Provide the first power voltage to the bit line when the data signal is asserted. Provide the second power voltage to the bit line when the data signal and the wafer level burn-in test signal are both asserted. The DRAM receives both the first power voltage and the second power voltage as power supply.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
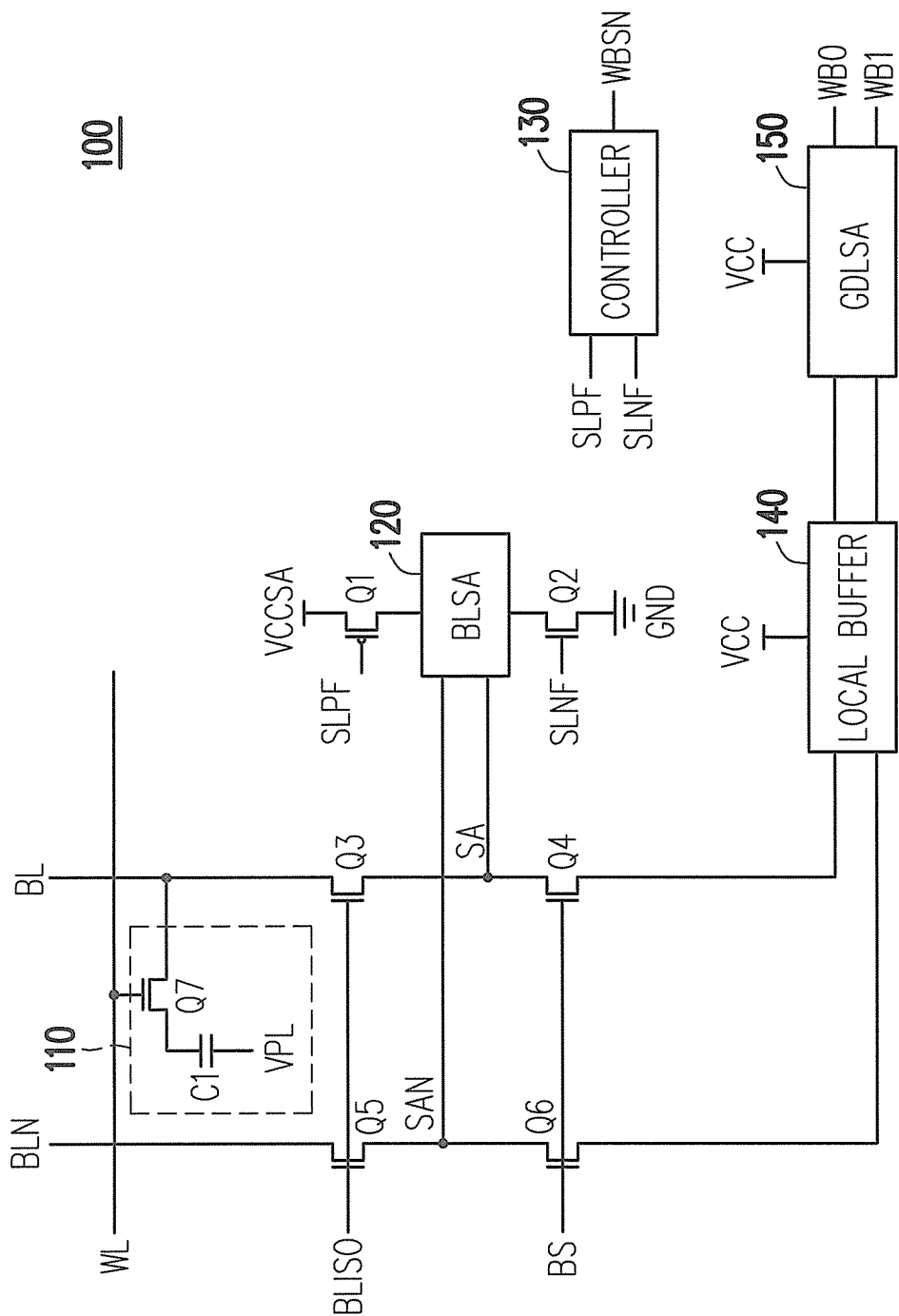
FIG. 1 is a schematic diagram showing a DRAM according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic diagram showing a DRAM 100 according to an embodiment of the present invention. DRAM 100 includes a word line WL, a memory cell 110, bit lines BL and BLN, six switches Q1-Q6, a BLSA 120, a controller 130, a local buffer 140, and a global data line sense amplifier (GDLSA) 150. FIG. 1 is only exemplary. The components shown in FIG. 1 may be only a part of the DRAM 100. For example, the DRAM 100 may include a memory cell array consisting of a plurality of memory cells and the memory cell 110 may be one of those memory cells.

The memory cell 110 is for storing a data bit. The memory cell 110 includes a switch Q7 and a capacitor C1. The switch Q7 is controlled by the word line WL and is coupled between the bit line BL and the capacitor C1. The capacitor C1 stores the data bit. Both the bit lines BL and BLN are associated with the memory cell 110.

The DRAM 100 receives both the power voltage VCCSA and the power voltage VCC as power supply. More specifically, the BLSA 120 receives the power voltage VCCSA as power supply, while the local buffer 140 and the GDLSA 150 receive the power voltage VCC as power supply. The power voltage VCCSA may be higher than the power voltage VCC in the wafer level burn-in test mode. For example, VCCSA may be 3.3V and VCC may be 1.8V. For another example, VCCSA may be 5V and VCC may be 3.3V.

The GDLSA 150 amplifies the data signals WB0 and WB1 and transmits the amplified data signals WB0 and WB1 to the local buffer 140. The local buffer 140 is coupled to the bit lines BL and BLN. The local buffer 140 buffers and further amplifies the data signals WB0 and WB1, and then drives the bit lines BL and BLN according to the amplified data signals WB0 and WB1. More specifically, the local buffer 140 provides the ground voltage GND to the bit line BL when the data signal WB0 is de-asserted. The local buffer 140 provides the power voltage VCC to the bit line BL when the data signal WB0 is asserted. On the other hand, the local buffer 140 provides the ground voltage GND to the bit line BLN when the data signal WB1 is de-asserted. The local buffer 140 provides the power voltage VCC to the bit line BLN when the data signal WB1 is asserted. The data signals WB0 and WB1 may be logically complementary or equal.

The BLSA 120 is coupled to the bit lines BL and BLN. The BLSA 120 provides the power voltage VCCSA to the bit line BL when the data signal WB0 and the wafer level burn-in test signal WBSN are both asserted. On the other hand, the BLSA 120 provides the power voltage VCCSA to the bit line BLN when the data signal WB1 and the wafer level burn-in test signal WBSN are both asserted. The wafer level burn-in test signal WBSN is asserted when the DRAM 100 is in the wafer level burn-in test mode.

The switch Q1 is coupled between the power voltage VCCSA and the BLSA 120. The switch Q2 is coupled between the BLSA 120 and the ground voltage GND. The controller 130 turns on or turns off the switches Q1 and Q2 according to the wafer level burn-in test signal WBSN.

When the wafer level burn-in test signal WBSN is asserted, the controller 130 outputs both the control signals SLPF and SLNF. The control signal SLPF turns on the switch Q1 to connect the BLSA 120 with the power voltage VCCSA and the control signal SLNF turns on the switch Q2 to connect the BLSA 120 with the ground voltage GND. Consequently, the BLSA 120 can charge the bit line BL to the power voltage VCCSA when the data signal WB0 is asserted and the BLSA 120 can charge the bit line BLN to the power voltage VCCSA when the data signal WB1 is asserted.

When the wafer level burn-in test signal WBSN is de-asserted, the controller 130 outputs both the control signals SLPF and SLNF. The control signal SLPF turns off the switch Q1 to disconnect the BLSA 120 from the power voltage VCCSA and the control signal SLNF turns off the switch Q2 to disconnect the BLSA 120 from the ground voltage GND.

In this embodiment, the switches Q1-Q7 are implemented with metal-oxide-semiconductor field-effect transistors (MOSFETs). However, the present invention is not limited to MOSFET switches. In some other embodiments of the present invention, one or more of the MOSFET switches Q1-Q7 may be replaced with any equivalent components.

Figure 2:
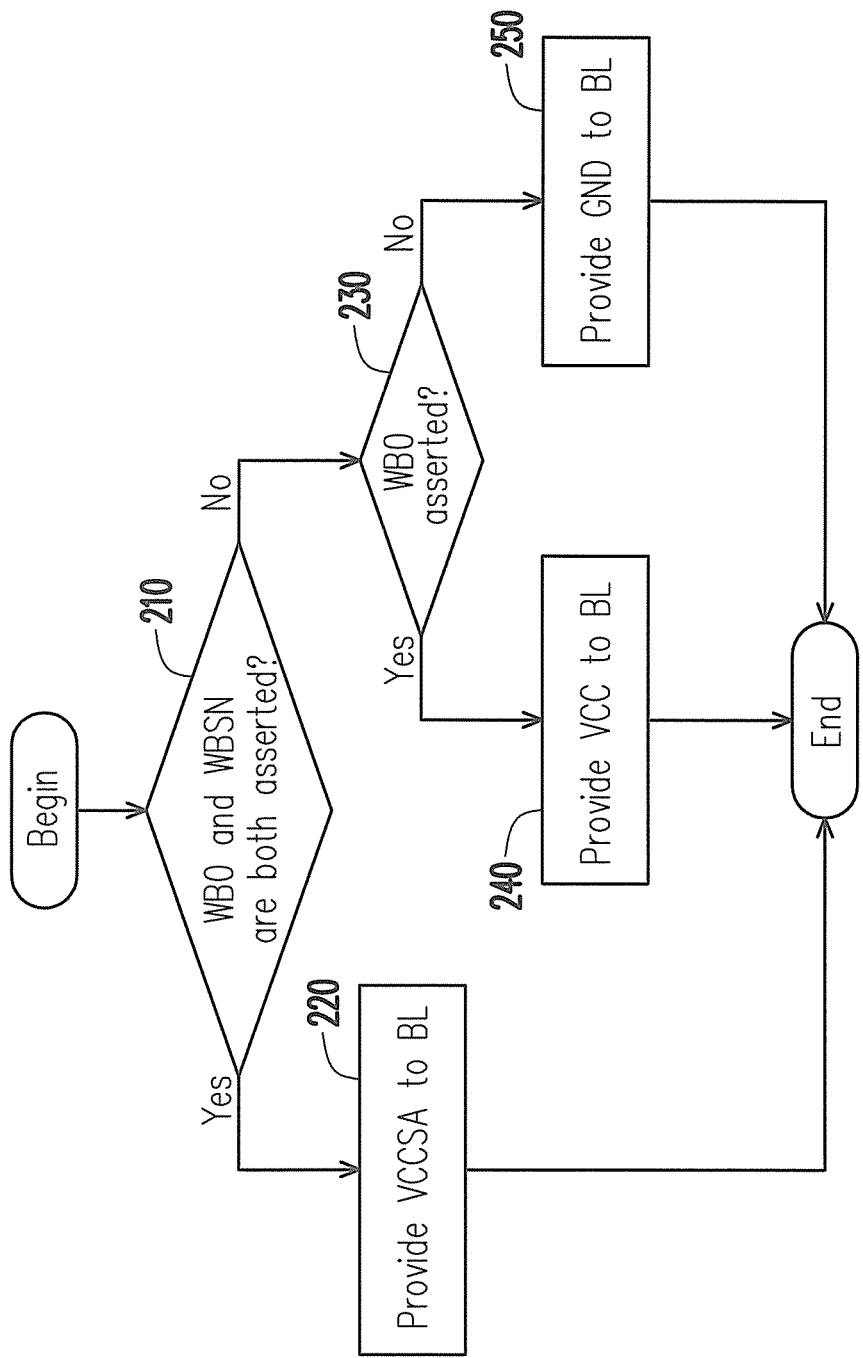
FIG. 2 and FIG. 3 are flow charts showing a method for testing a DRAM according to an embodiment of the present invention.
Figure 3:
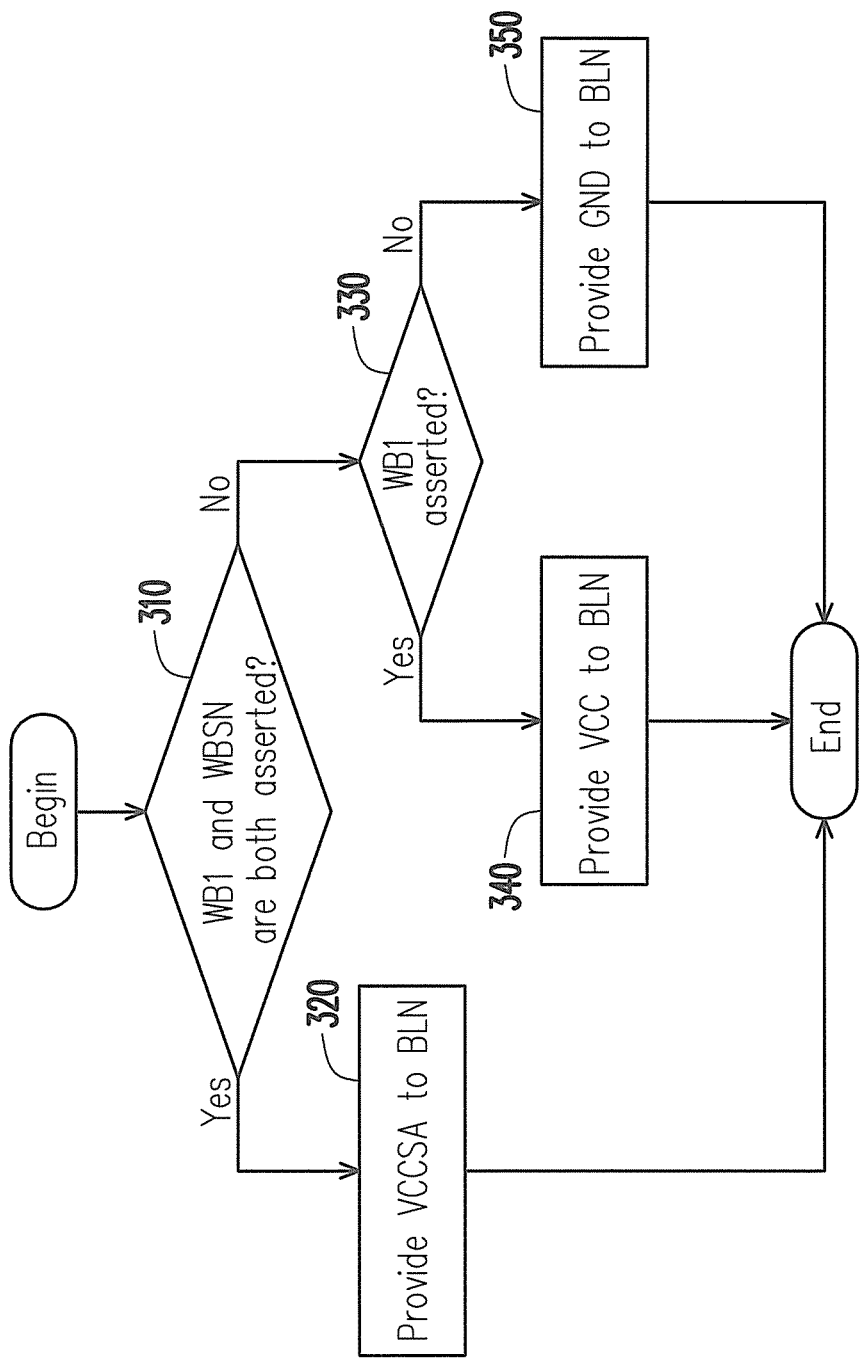

FIG. 2 and FIG. 3 are flow charts showing a method for testing a DRAM according to an embodiment of the present invention. This method may be executed by the DRAM 100 shown in FIG. 1 or any other similar apparatus to perform a wafer level burn-in test. The flow in FIG. 2 begins at checking whether the data signal WB0 and the wafer level burn-in test signal WBSN are both asserted or not (step 210). Provide the power voltage VCCSA to the bit line BL when the data signal WB0 and the wafer level burn-in test signal WBSN are both asserted (step 220). Otherwise, check whether the data signal WB0 is asserted or not (step 230). Provide the power voltage VCC to the bit line BL when the data signal WB0 is asserted (step 240). Provide the ground voltage GND to the bit line BL when the data signal WB0 is de-asserted (step 250).

Similarly, the flow in FIG. 3 begins at checking whether the data signal WB1 and the wafer level burn-in test signal WBSN are both asserted or not (step 310). Provide the power voltage VCCSA to the bit line BLN when the data signal WB1 and the wafer level burn-in test signal WBSN are both asserted (step 320). Otherwise, check whether the data signal WB1 is asserted or not (step 330). Provide the power voltage VCC to the bit line BLN when the data signal WB1 is asserted (step 340). Provide the ground voltage GND to the bit line BLN when the data signal WB1 is de-asserted (step 350).

Figure 4:
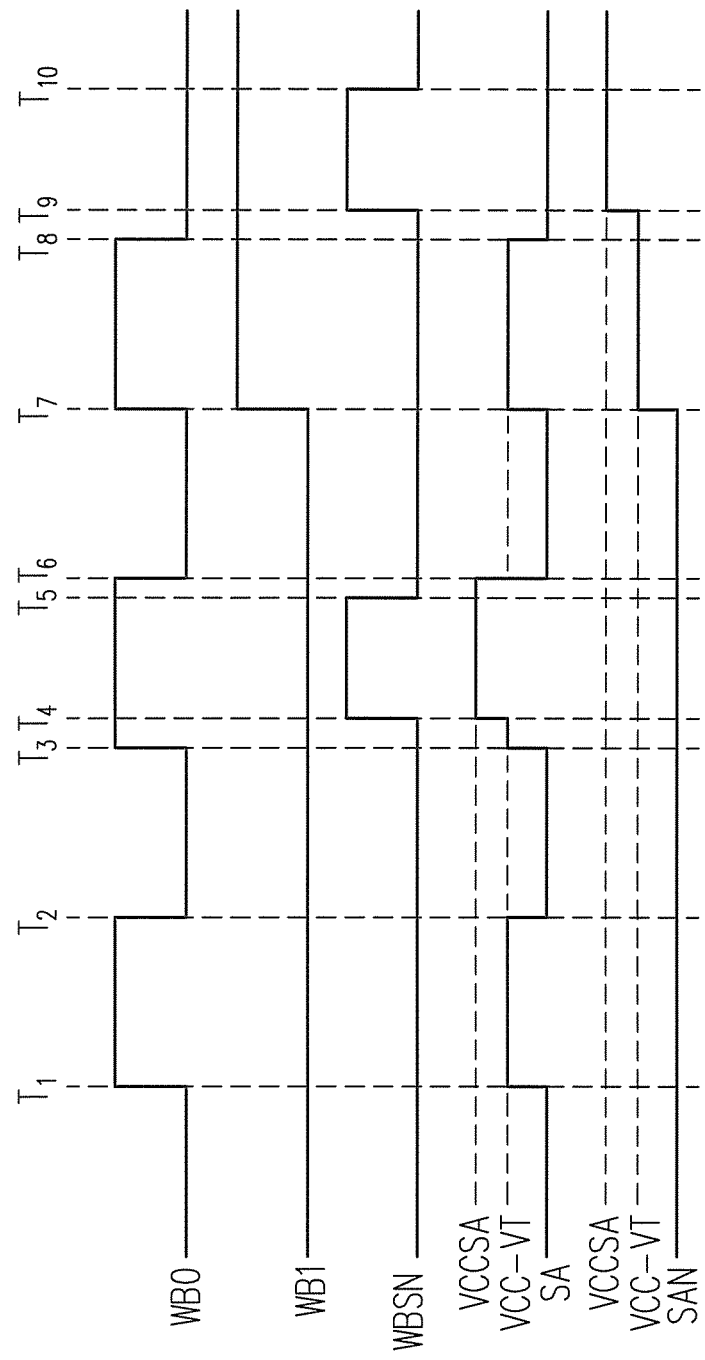
FIG. 4 is an exemplary diagram showing the waveforms of some signals in a DRAM according to an embodiment of the present invention

FIG. 4 is an exemplary diagram showing the waveforms of the data signals WB0 and WB1, the wafer level burn-in test signal WBSN, and the voltages at the nodes SA and SAN in the DRAM 100 in the wafer level burn-in test mode according to an embodiment of the present invention. At first, the word line WL is turned on. The control signals BLISO and BS are asserted to turn on the switches Q3-Q6.

At the moment $T_1$, the data signal WB0 is asserted. The local buffer 140 provides the power voltage VCC to the bit line BL. In response, the voltage at the node SA rises to VCC-VT. VT is the voltage drop across the switches Q4 and Q6. In other words, VT is the threshold voltage of the MOSFETs Q4 and Q6. At the moment $T_2$, the data signal WB0 is de-asserted. The local buffer 140 provides the ground voltage GND to the bit line BL. In response, the voltage at the node SA drops to GND.

At the moment $T_3$, the data signal WB0 is asserted again. The voltage at the node SA rises to VCC-VT. At the moment $T_4$, the wafer level burn-in test signal WBSN is asserted. The BLSA 120 provides the power voltage VCCSA to the bit line BL. In response, the voltage at the node SA rises from VCC-VT to VCCSA. The bit line BL is first charged to the voltage VCC-VT and then charged to the voltage VCCSA. This two-step charging prevents the problem of big pick current. At the moment $T_5$, the wafer level burn-in test signal WBSN is de-asserted. At the moment $T_6$, the data signal WB0 is de-asserted. Accordingly, the voltage at the node SA drops from VCCSA to GND. In can be seen in the time span from $T_3$ to $T_6$ that, when the data signal WB0 and the wafer level burn-in test signal WBSN are both asserted, the wafer level burn-in test signal WBSN is asserted after the data signal WB0 is asserted and the wafer level burn-in test signal WBSN is de-asserted before the data signal WB0 is de-asserted.

At the moment $T_7$, both the data signals WB0 and WB1 are asserted. The local buffer 140 provides the power voltage VCC to the bit lines BL and BLN. In response, the voltages at both the nodes SA and SAN all rise to VCC-VT. At the moment $T_8$, the data signal WB0 is de-asserted. The local buffer 140 provides the ground voltage GND to the bit line BL. In response, the voltage at the node SA drops to GND. At the moment $T_9$, the wafer level burn-in test signal WBSN is asserted. The BLSA 120 provides the power voltage VCCSA to the bit line BLN. In response, the voltage at the node SAN rises from VCC-VT to VCCSA. The bit line BLN is first charged to the voltage VCC-VT and then charged to the voltage VCCSA. This two-step charging prevents the problem of big pick current. At the moment $T_{10}$, the wafer level burn-in test signal WBSN is de-asserted. In can be seen in the time span from $T_7$ to $T_{10}$ that, when the data signal WB1 and the wafer level burn-in test signal WBSN are both asserted, the wafer level burn-in test signal WBSN is asserted after the data signal WB1 is asserted and the wafer level burn-in test signal WBSN is de-asserted before the data signal WB1 is de-asserted.

In summary, the aforementioned DRAM and method for testing the DRAM can charge the bit lines of the DRAM to a voltage level higher than that of the regular power supply in the wafer level burn-in test mode, thus improving the burn-in effect and the wafer level burn-in test. The two-step charging of the bit lines can prevent the problem of big pick current. Moreover, the aforementioned DRAM and method for testing the DRAM are easy to perform on DRAM chips.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dynamic random-access memory (DRAM), comprising:
    a memory cell for storing a data bit;
    a first bit line associated with the memory cell;
    a local buffer coupled to the first bit line, receiving a first power voltage as power supply, providing a ground voltage to the first bit line when a first data signal is de-asserted and providing the first power voltage to the first bit line when the first data signal is asserted;

a bit line sense amplifier (BLSA) coupled to the first bit line, receiving a second power voltage as power supply, providing the second power voltage to the first bit line when the first data signal and a wafer level burn-in test signal are both asserted, wherein the second power voltage is higher than the first power voltage, the wafer level burn-in test signal is asserted when the DRAM is in a wafer level burn-in test mode;

a first switch, coupled between the second power voltage and the BLSA;

a second switch, coupled between the BLSA and the ground voltage; and a controller, turning on or turning off the first switch and the second switch according to the wafer level burn-in test signal.

2. The DRAM of claim 1, further comprising:

a second bit line associated with the memory cell, wherein the local buffer is coupled to the second bit line, the local buffer provides the ground voltage to the second bit line when a second data signal is de-asserted and provides the first power voltage to the second bit line when the second data signal is asserted, the BLSA is also coupled to the second bit line, the BLSA provides the second power voltage to the second bit line when the second data signal and the wafer level burn-in test signal are both asserted.

3. The DRAM of claim 2, wherein the first data signal and the second data signal are logically complementary or equal.

4. The DRAM of claim 2, wherein when the first data signal and the wafer level burn-in test signal are both asserted, the wafer level burn-in test signal is asserted after the first data signal is asserted and the wafer level burn-in test signal is de-asserted before the first data signal is de-asserted;

when the second data signal and the wafer level burn-in test signal are both asserted, the wafer level burn-in test signal is asserted after the second data signal is asserted and the wafer level burn-in test signal is de-asserted before the second data signal is de-asserted.

5. The DRAM of claim 1, wherein the controller turns on the first switch and the second switch when the wafer level burn-in test signal is asserted, the controller turns off the first switch and the second switch when the wafer level burn-in test signal is de-asserted.

6. A method for testing a dynamic random-access memory (DRAM), comprising:

providing a ground voltage to a first bit line associated with a memory cell of the DRAM when a first data signal is de-asserted;

providing a first power voltage to the first bit line when the first data signal is asserted;

providing a second power voltage to the first bit line when the first data signal and a wafer level burn-in test signal are both asserted, wherein the DRAM receives both the first power voltage and the second power voltage as power supply, the second power voltage is higher than the first power voltage, the wafer level burn-in test signal is asserted when the DRAM is in a wafer level burn-in test mode, a bit line sense amplifier (BLSA) provides the second power voltage to the first bit line;

connecting the BLSA to the second power voltage or disconnecting the BLSA from the second power voltage according to the wafer level burn-in test signal; and connecting the BLSA to the ground voltage or disconnecting the BLSA from the ground voltage according to the wafer level burn-in test signal.

7. The method of claim 6, further comprising:

providing the ground voltage to a second bit line associated with the memory cell of the DRAM when a second data signal is de-asserted;

providing the first power voltage to the second bit line when the second data signal is asserted; and providing the second power voltage to the second bit line when the second data signal and the wafer level burn-in test signal are both asserted.

8. The method of claim 7, wherein the first data signal and the second data signal are logically complementary or equal.

9. The method of claim 7, further comprising:

when asserting both the first data signal and the wafer level burn-in test signal, asserting the wafer level burn-in test signal after asserting the first data signal and de-asserting the wafer level burn-in test signal before de-asserting the first data signal;

when asserting both the second data signal and the wafer level burn-in test signal, asserting the wafer level burn-in test signal after asserting the second data signal and de-asserting the wafer level burn-in test signal before de-asserting the second data signal.

* * * * *